(12) United States Patent
Polizzo (10) Patent No.: US 7,777,567 B2
(45) Date of Patent: Aug. 17, 2010

(54) RF POWER AMPLIFIER STABILITY NETWORK

(75) Inventor: Salvatore Polizzo, Henrietta, NY (US)

(73) Assignee: MKS Instruments, Inc., Andover, MA (US)

(*) Notice: Subject to any disclaimer, the term of this patent is extended or adjusted under 35 U.S.C. 154(b) by 875 days.

(21) Appl. No.: 11/627,002

(22) Filed: Jan. 25, 2007

(65) Prior Publication Data

US 2008/0180179 A1  Jul. 31, 2008

(51) Int. Cl.
*H03F 3/04* (2006.01)

(52) U.S. Cl. ............... 330/251; 315/111.21; 333/17.3; 333/32

(58) Field of Classification Search .................
315/111.21–111.71, 111.81; 330/250, 251, 330/305, 306, 187; 333/17.3, 18, 32
See application file for complete search history.

(56) References Cited

U.S. PATENT DOCUMENTS

| 5,187,457 A | 2/1993 | Chawla et al. |
| 5,189,601 A | 2/1993 | Sellers |
| 5,195,045 A | 3/1993 | Keane et al. |
| 5,249,141 A | 9/1993 | Vandebroek et al. |
| 5,291,063 A | 3/1994 | Adishian |
| 5,323,329 A | 6/1994 | Keane |
| 5,451,907 A | 9/1995 | Keane et al. |
| 5,477,188 A | 12/1995 | Chawla et al. |
| 5,488,331 A | 1/1996 | Keane et al. |
| 5,537,080 A | 7/1996 | Chawla et al. |
| 5,565,737 A | 10/1996 | Keane |
| 5,584,974 A | 12/1996 | Sellers |
| 5,598,689 A | 2/1997 | Bork |
| 5,627,738 A | 5/1997 | Lubomirsky et al. |
| 5,651,868 A | 7/1997 | Canady et al. |
| 5,717,293 A | 2/1998 | Sellers |
| 5,726,603 A | 3/1998 | Chawla et al. |
| 5,733,821 A | 3/1998 | Nishikawa et al. |
| 5,737,169 A | 4/1998 | Sellers |
| 5,747,935 A | 5/1998 | Porter et al. |
| 5,748,042 A | 5/1998 | Norris et al. |
| 5,770,023 A | 6/1998 | Sellers |
| 5,770,922 A | 6/1998 | Gerrish et al. |
| 5,810,982 A | 9/1998 | Sellers |
| 5,842,154 A | 11/1998 | Harnett |

(Continued)

*Primary Examiner*—Douglas W Owens
*Assistant Examiner*—Ephrem Alemu
(74) *Attorney, Agent, or Firm*—Harness, Dickey & Pierce, P.L.C.

(57) ABSTRACT

A radio frequency (RF) generator for applying RF power to a plasma chamber includes a DC power supply (B+). A radio frequency switch generates the RF power at a center frequency $f_0$. A low-pass dissipative terminated network connects between the DC power supply (B+) and the switch and includes operates at a first cutoff frequency. The switch outputs a signal to an output network which improves the fidelity of the system. The output network generates an output signal fed to a high-pass subharmonic load isolation filter that passes RF power above a predetermined frequency. A low-pass harmonic load isolation filter may be inserted between the output network and the high-pass subharmonic load isolation filter, and a high-pass terminated network may connect to the output of the output network. The high-pass terminated network dissipates RF power above a predetermined frequency. An offline short or shunt network may connect between the output of the switch and the input of the output network for shorting the output of the switch at predetermined frequencies.

71 Claims, 12 Drawing Sheets

U.S. PATENT DOCUMENTS

| | | | |
|---|---|---|---|
| 5,929,717 A * | 7/1999 | Richardson et al. ........ 333/17.3 |
| 5,971,591 A | 10/1999 | Vona et al. |
| 6,020,636 A | 2/2000 | Adishian |
| 6,020,794 A | 2/2000 | Wilbur |
| 6,046,546 A | 4/2000 | Porter et al. |
| 6,046,641 A | 4/2000 | Chawla et al. |
| 6,064,559 A | 5/2000 | Church, Jr. |
| 6,199,506 B1 | 3/2001 | Hilliker et al. |
| 6,384,540 B1 | 5/2002 | Porter, Jr. et al. |
| 6,587,019 B2 | 7/2003 | Chawla et al. |
| 6,631,693 B2 * | 10/2003 | Hilliker ................. 315/111.21 |
| 6,750,711 B2 | 6/2004 | Chawla et al. |
| 6,949,978 B2 | 9/2005 | Tayrani et al. |
| 2005/0088231 A1 * | 4/2005 | Ziegler ....................... 330/251 |
| 2005/0134186 A1 * | 6/2005 | Brouk et al. ........... 315/111.21 |
| 2006/0232471 A1 | 10/2006 | Coumou |

* cited by examiner

RF POWER AMPLIFIER STABILITY NETWORK

FIELD

The present disclosure relates to a system and method for stabilizing radio frequency (RF) power amplifiers in a plasma processing system.

BACKGROUND

The statements in this section merely provide background information related to the present disclosure and may not constitute prior art.

Plasma processing systems are used in semiconductor fabrication. The system employs a plasma chamber that changes the electrical characteristics of a raw material (e.g. silicon) to manufacture semiconductor components. Examples of such components include transistors, medium and large state inductors, microprocessors, and random-access memory. The plasma chamber can perform sputtering, plasma etching, plasma deposition, and/or reactive ion etching in the manufacturing process.

In operation, the plasma chamber holds a semiconductor work-piece. Gas is then introduced into the plasma chamber at low pressure. An RF power generator applies RF power to the plasma chamber. The RF power changes the gas from a gaseous state to plasma. The plasma comprises electrically-charged ions that react with exposed regions of the semiconductor work-piece. A combination of these operations is performed on the work-piece to produce a particular semiconductor component.

Figure 1:
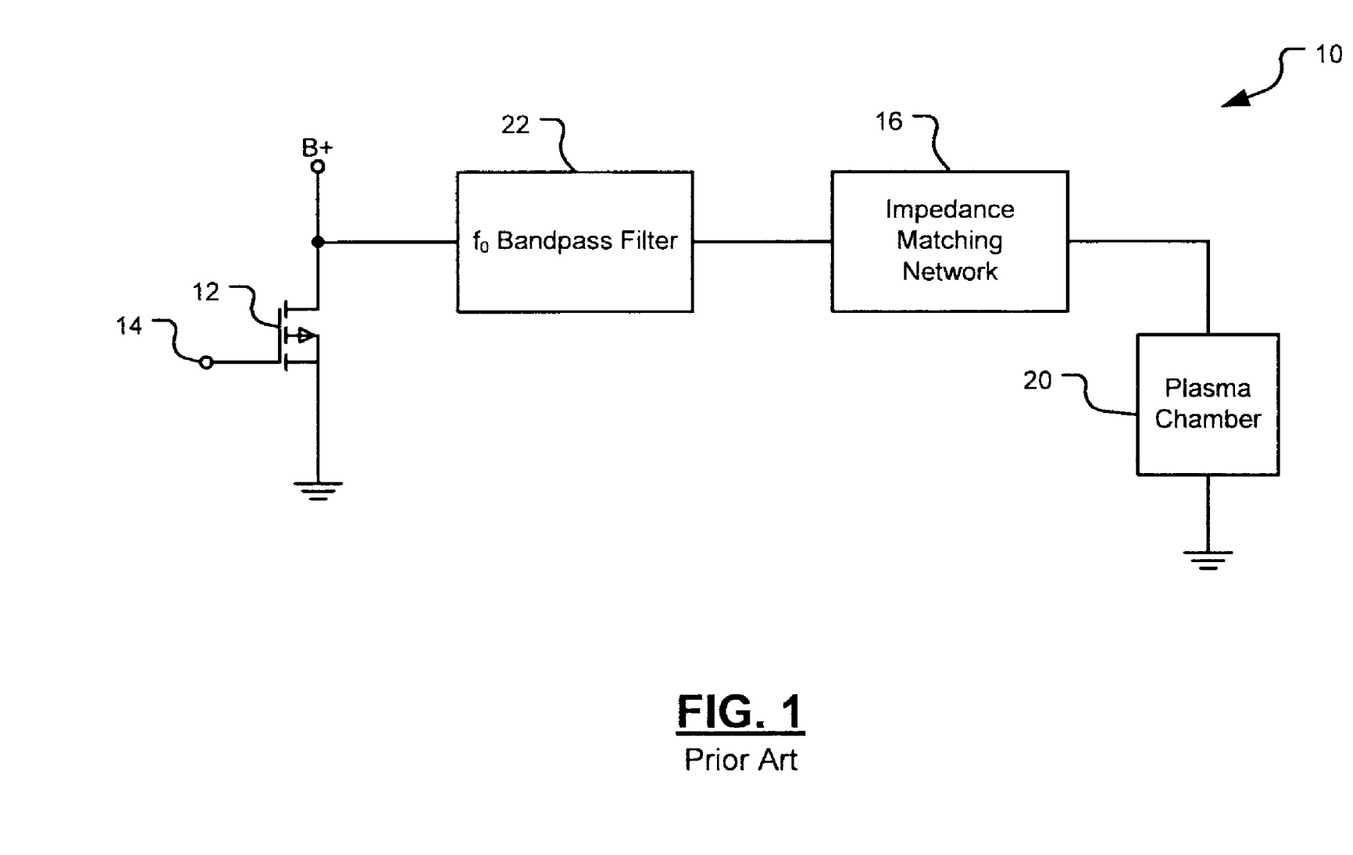
FIG. 1 is a functional block diagram of a plasma processing system according to the prior art.

Referring now to FIG. 1, portions of a typical plasma processing system 10 are shown. An RF power generator includes one or more output transistors 12. A direct current (DC) power supply provides power B+ to transistor 12. In some embodiments the DC power supply includes a switching power supply or power amplifier (PA). Output transistor 12 develops the RF power in accordance with an RF drive signal 14. The RF power communicates with an impedance matching network 16. An output of impedance matching network 16 communicates with an input of a plasma chamber 20, which typically has an input impedance of 50 ohms. Some installations include one or more dissipative bandpass filters 22 that connect in the feed line between transistor 12 and a load, shown as plasma chamber 20.

Transistor 12 typically generates the RF power at a single center frequency $f_0$. During operation the input impedance of plasma chamber 20 varies continuously and spontaneously due to natural properties of the plasma. These input impedance variations cause drops in the power coupling efficiency between transistor 12 and plasma chamber 20. The input impedance variations can also cause RF energy to reflect from plasma chamber 20 back to transistor 12. The reflected RF energy can cause instability in the power delivery system and damage transistor 12. Filter 22 can be used to dissipate the reflected energy that occurs at frequencies outside of a passband of centered at center frequency $f_0$. Examples of filters 22 are disclosed by Chawla et al. in U.S. Pat. No. 5,187,457, entitled "Harmonic and Subharmonic Filter", assigned to the assignee of the present invention.

In applications where B+ is provided by a switching power supply the reflected RF energy can also cause the power supply to become unstable. Examples of filters 22 to address such situations are disclosed by Porter et al. in U.S. Pat. No. 5,747,935, entitled "Method and Apparatus for Stabilizing Switch Mode Powered RF Plasma Processing".

Figure 2:
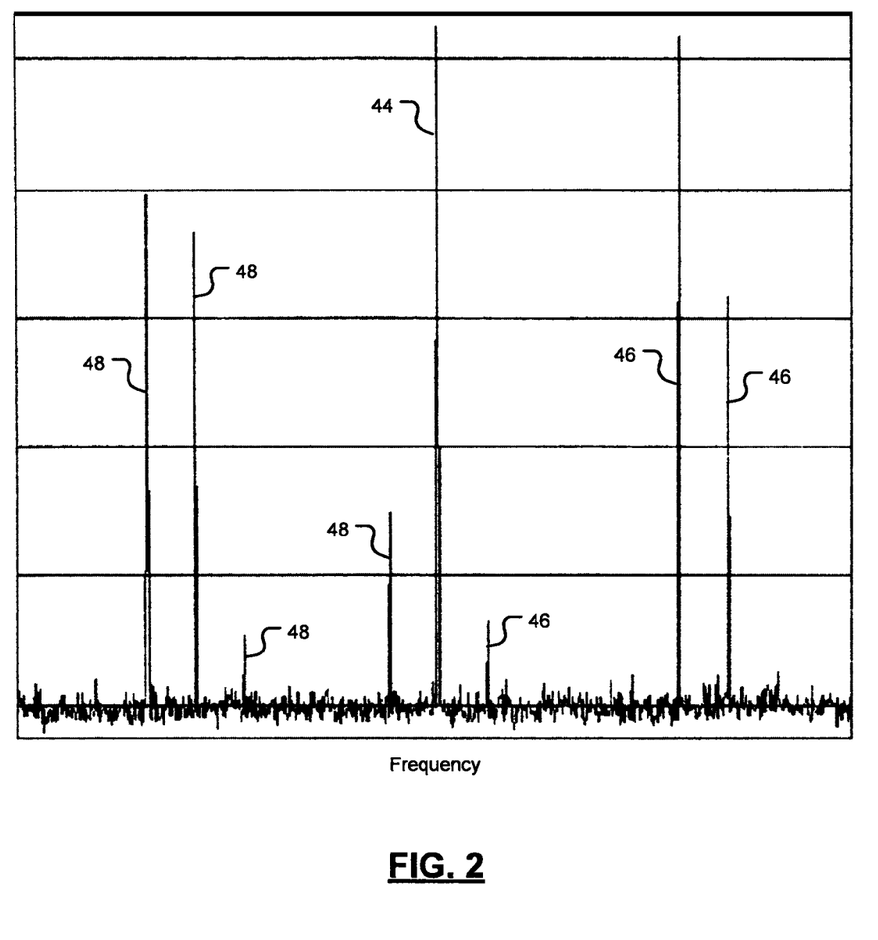
FIG. 2 is a test measurement of power perturbations due to the out-of-band interactions between the output transistor and the load.
Figure 3:
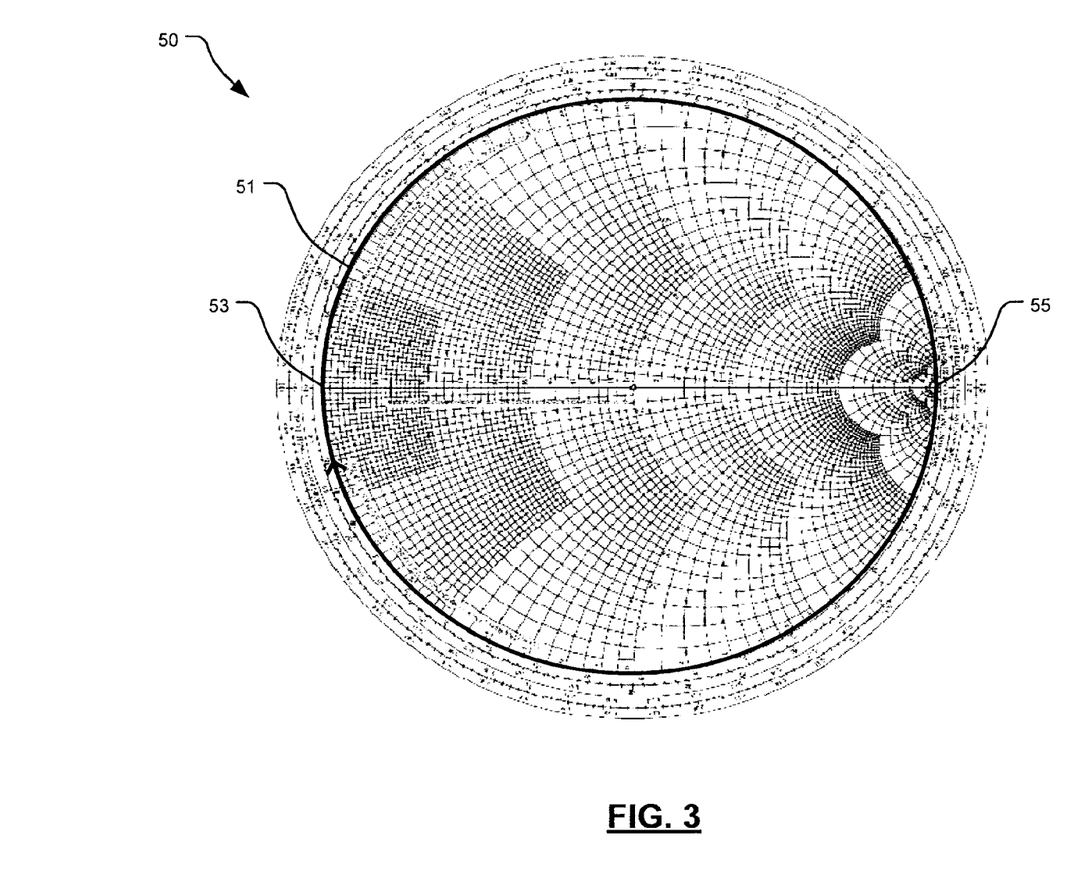
FIG. 3 is a Smith chart of example power reflections in a plasma processing system.

Referring now to FIG. 2, a non-limiting example of a test measurement illustrates effects of the variations that the impedance of the plasma has on the stability of the system. A horizontal axis represents frequency over a range centrally located around a frequency $f_0$. A vertical axis represents power coupled into plasma chamber 20. A peak at 44 represents desirable power coupling at center frequency $f_0$. The plasma chamber input impedance variations contribute to peaks 46 at frequencies above center frequency $f_0$ and peaks 48 at frequencies below center frequency $f_0$. The peaks 46 and 48 indicate power at frequencies other than the fundamental frequency 44, such frequencies being generally undesirable. FIG. 3 depicts a Smith chart 50 illustrating the varying nature of the impedance match between transistor 12 and plasma chamber 20. A plot 51 of the impedance match crosses the real (horizontal) axis of Smith chart 50 at points 53 and 55. The crossings indicate resonance in chamber 20.

Figure 4:
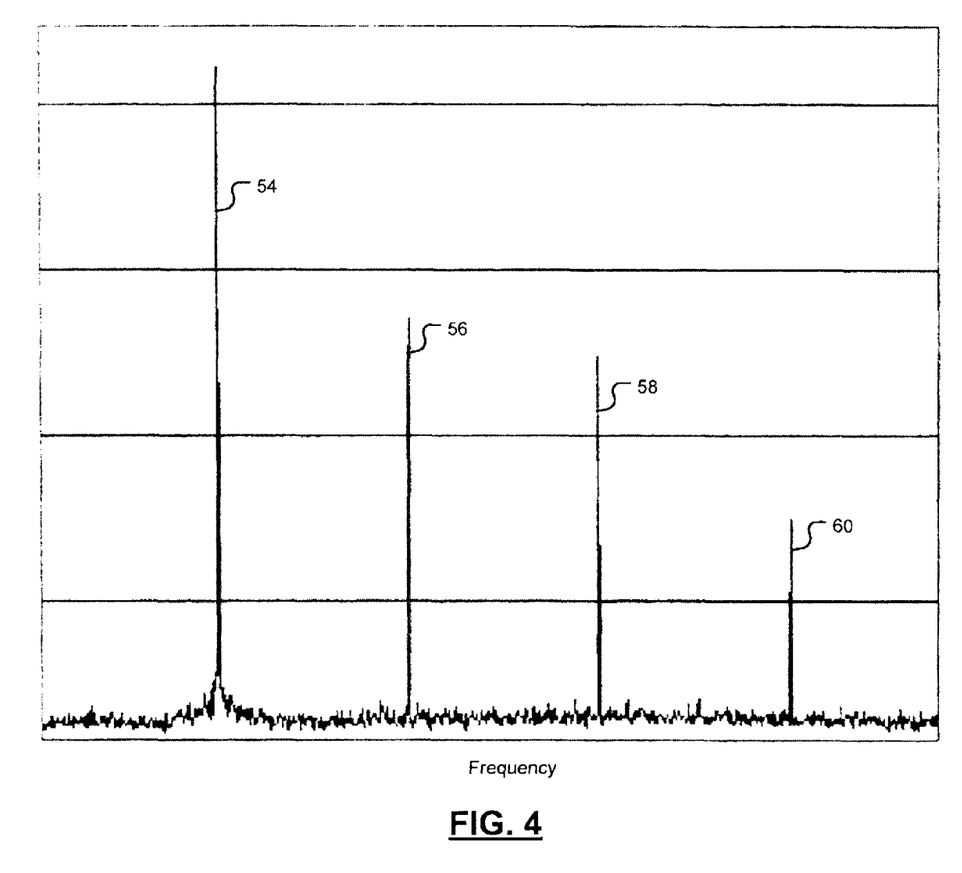
FIG. 4 is test measurement of power coupling due to harmonic distortion.

Referring now to FIG. 4 a non-limiting example of a test measurement illustrates an example of harmonic distortions that cause a loss of fidelity in the RF power over a frequency range. Fidelity generally refers to the undistorted propagation of the RF power from transistor 12 to the input of plasma chamber 20. The horizontal axis represents frequency, and the vertical axis represents power output by the power amplifier. A first peak 54 occurs at center frequency $f_0$. A second peak 56, third peak 58, and fourth peak 60 occur at increasing integer multiples of center frequency $f_0$. The amplitudes of second peak 56, third peak 58, and fourth peak 60 are progressively less than the amplitude of first peak 54. Energy at the second peak 56, third peak 58, and fourth peak 60 indicates that the RF power would be distorted at plasma chamber 20 without additional filtering. The fidelity is therefore less than ideal.

SUMMARY

A radio frequency (RF) generator for applying RF power to a plasma chamber includes a DC power supply. A radio frequency transistor generates the RF power at a center frequency. A low-pass dissipative terminated network connects between the DC power supply and the transistor and includes a first cutoff frequency that is less than the center frequency.

An RF generator for applying RF power to a plasma chamber can also include a DC power supply, a radio frequency transistor that generates the RF power at a center frequency, and a high-pass filter in series with the RF power. The high-pass filter includes a cutoff frequency that is less than the center frequency.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present teachings in any way.

DETAILED DESCRIPTION

The following description of various embodiments is merely exemplary in nature and is in no way intended to limit the present teachings, application, or uses. Throughout this specification, like reference numerals will refer to similar elements.

Figure 5:
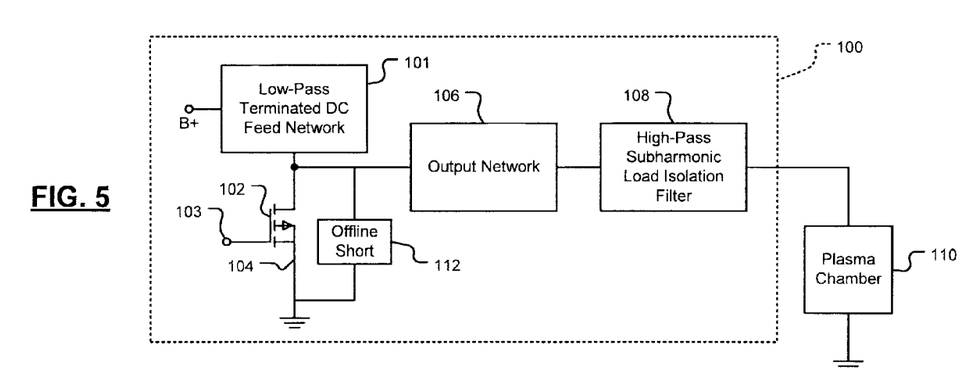
FIG. 5 is a functional block diagram of a plasma processing system that includes a stability network.

Referring now to FIG. 5 one of several embodiments of a plasma processing system 100 is shown. A direct current (DC) voltage B+ can be generated by a half-bridge and/or full bridge switching power supply. A low-pass terminated DC feed network (LPT network) 101 inline with the DC feed couples B+ to a drain or collector of an RF transistor 102. LPT network 101 is reactive in-band and dissipates RF power occurring below a first cutoff frequency $f_{c1}$. In various embodiments, the first cutoff frequency $f_{c1}$ is generally less than center frequency $f_0$. LPT network 101 is described below in more detail.

Transistor 102 is shown as a single metal-oxide-silicon field effect transistor (MOSFET), however it should be appreciated that other transistor arrangements and types may be employed. For example, transistor 102 may be any three terminal semiconductor device where one of the terminals controls a conductance through and/or voltage across the other two terminals. Transistor 102 may also be implemented as a single chip and/or a single die MOSFET transistor. In some embodiments, transistor 102 can be implemented as a multiple-die kilowatt power transistor (KPT). Transistor 102 may also be implemented as one or more insulated-gate bipolar transistors (IGBT). The selection of a particular arrangement and type of transistor 102 can be based on factors such as a desired RF power magnitude, the voltage of B+, a frequency range of the RF power, the ability to dissipate reflected energy, and so forth.

A gate or base of transistor 102 receives an RF drive signal 103 at the center frequency $f_0$. When system 100 employs FM, the frequency of drive signal 103 modulates above and below center frequency $f_0$. In some embodiments, the range of modulation is between about +/−5% and +/−10% of center frequency $f_0$, but it can incorporate larger ranges according to various embodiments. A source or emitter 104 of transistor 102 couples to ground. The drain couples to an input of an output network 106. In some embodiments, output network 106 preserves fidelity of RF power that is generated at the drain of transistor 102. Details of output network 106 are provided below. Output network 106 communicates with an input of a high-pass sub-harmonic load isolation filter (HPSH filter) 108. HPSH filter 108 passes frequency components that are greater than a second predetermined cutoff frequency $f_{c2}$. In various embodiments, the second predetermined cutoff frequency $f_{c2}$ is generally less than center frequency $f_0$ and may approximately equal $f_{c1}$. Details of HPSH filter 108 are provided below.

The drain of transistor 102 also communicates with an offline short 112. Offline short 112 operates at a frequency typically less than the center frequency $f_0$, and, in some embodiments, operates at a frequency $f_0/2$. Offline short 112 will be described in greater detail below. An output of HPSH filter 108 communicates with an input to a plasma chamber 110. In some embodiments, an impedance matching network, such as shown in FIG. 1, can be coupled in series with the input of plasma chamber 110.

LPT network 101 and HPSH filter 108 generally provide a pair of networks surrounding transistor 102 that cooperate to assist in providing a controlled out-of-band frequency response that is not affected by changes in the load, plasma chamber 110. LPT network 101 provides a low pass structure offline from the RF path which enables low frequency impedance control for transistor 102. LPT network 101 works in conjunction with HPSH filter 108. HPSH filter 108 provides a high pass circuit in inline with the RF which isolates the load at sub-harmonic frequencies being controlled. The combination of LPT network 101 and HPSH filter 108 allows transistor 102 to experience the impedance presented to it by LPT network 101. This allows control of the sub-harmonic impedances independent of load variation. LPT network 101 and HPSH filter 108 thus act in a complimentary manner to improve the stability of processing system 100. In some embodiments, it is not necessary to feed the DC component applied to transistor 102 through LPT network 101. Further, HPSH filter 108 may be partially or entirely integrated into output network 106 in order to provide impedance matching functionality.

The configuration of FIG. 5 enables transistor 102 to operate under a controlled, load independent, real impedance in the sub-harmonic region, as impedance varies in accordance with the frequency. This prevents high frequency, sub-harmonic resonances created by the load, plasma chamber 110, from being transferred to the output node of transistor 102. This effectively isolates the load, plasma chamber 110, from transistor 102 below the frequency of operation. LPT 101 and HPSH filter 108 thus cooperate to improve the stability of processing system 100. Offline short 112 can further cooperate with LPT 101 and HPSH filter 108 to further condition the impedance at transistor 102 at sub-harmonic frequencies, thereby further improving stability of processing system 100.

Figure 6:
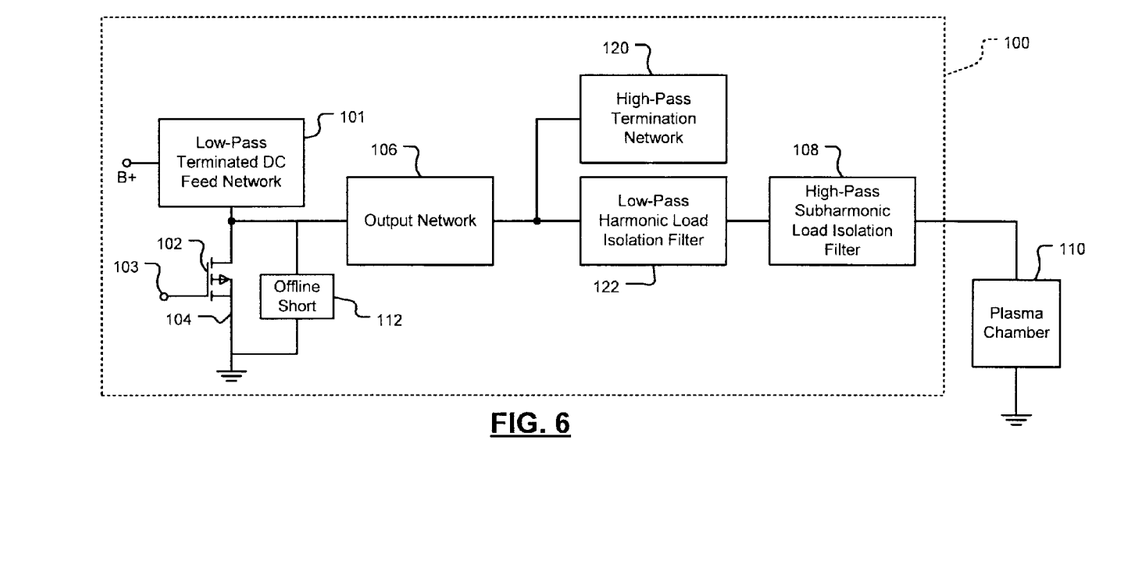
FIG. 6 is a functional block diagram of the plasma processing system of FIG. 5 wherein the stability network includes a high-pass terminated network and a low-pass harmonic load-isolation filter.

Referring now to FIG. 6, one of several embodiments of processing system 100 is shown with a high-pass terminated network (HPT network) 120 and a low-pass harmonic load-isolation filter (LPHI filter) 122. HPT network 120 connects to the output of output network 106. LPHI filter 122 connects between output network 106 and HPSH filter 108. HPT network 120 dissipates RF power that occurs at frequencies above a third predetermined cutoff frequency $f_{c3}$. In some embodiments, the third predetermined cutoff frequency $f_{c3}$ is generally in a frequency range of $f_0$ to $2f_0$. LPHI filter 122 passes RF energy that occurs below a fourth predetermined cutoff frequency $f_{c4}$. In various embodiments, the fourth predetermined cutoff frequency $f_{c4}$ is greater than $f_0$ and may be generally approximately equal to $f_{c3}$. LPT network 101, output network 106, HPSH filter 108, HPT network 120, and LPHI filter 122 are collectively referred to as the stability network. It should be understood by one skilled in the art that the components of FIG. 6 can be arranged in different configurations. It will also be understood that the arranging of the components of FIG. 6 may result in different topologies of the individual components.

As discussed above, while LPT network 101 and HPSH filter 108 provide sub-harmonic isolation to transistor 102, HPT network 120 and LPHI filter 122 cooperate to provide isolation to transistor 102 above the frequencies of operation. This cooperation improves the fidelity of the output of processing system 100 while requiring minimal additional filter components. In some embodiments, HPT network 120 and LPHI filter 122 operate in complimentary manner to provide high frequency impedance conditioning and terminated. The system of FIG. 6 isolates the load from the transistor both above and below the frequency of operation and provides a controlled, real impedance to transistor 102 within the bandwidth of operation. The inline circuits, LPHI filter 122 and HPSH filter 108, in some embodiments, can be configured to compensate for each other, allowing the amplifier system to achieve broadband operation and a high degree of load isolation below and above the frequency of operation. Further yet, the inline components, LPHI filter 122 and HPSH filter 108, in some embodiments, may be designed to compensate each other, such as by phase compensation, so that the impedance for the frequency band of operation remains constant as a function of frequency. Such complimentary networks, enable processing system 100 to maintain a generally consistent efficiency over a broad range of frequencies.

Figure 7:
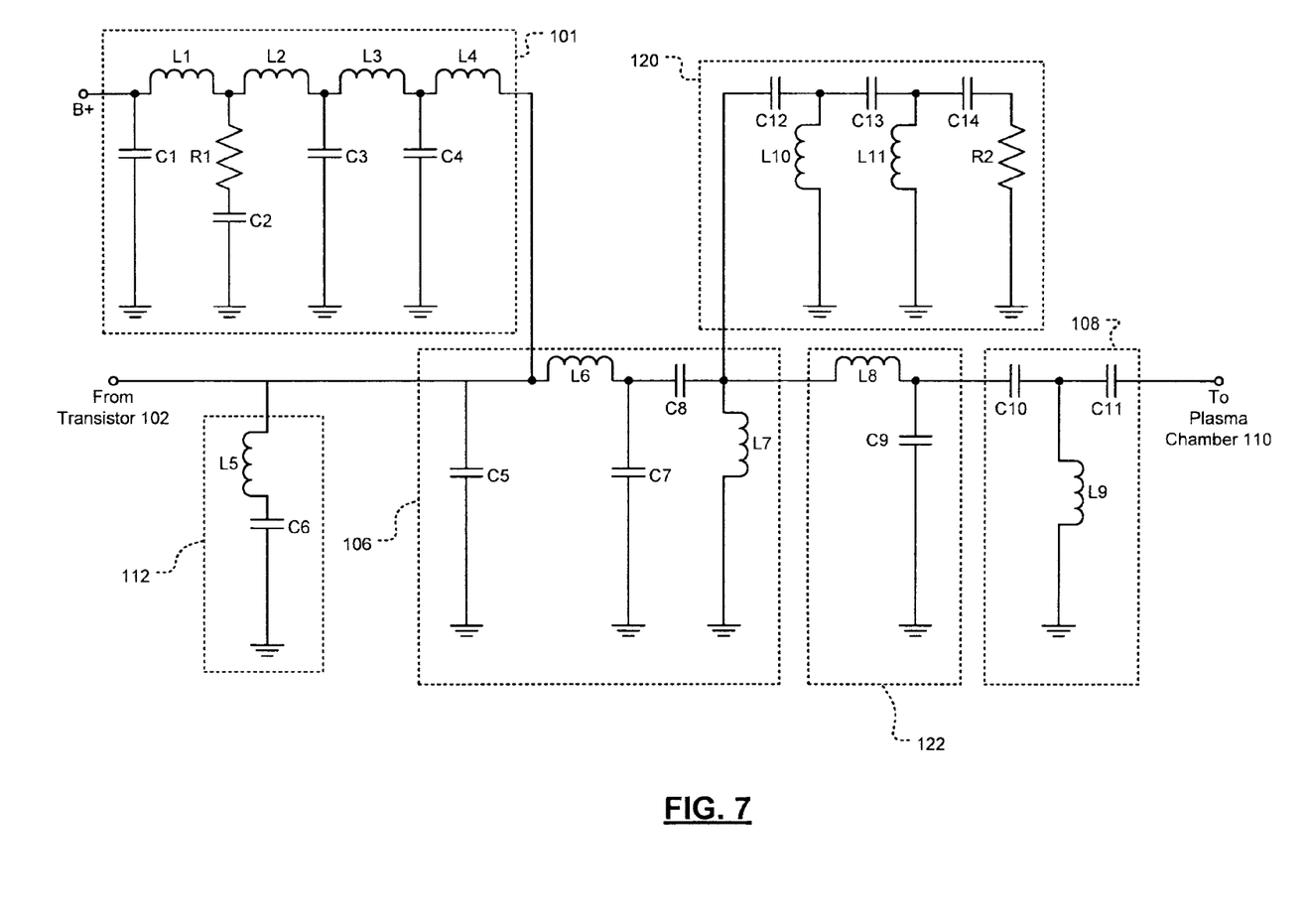
FIG. 7 is a schematic diagram of a stability network.

Referring now to FIG. 7, a schematic diagram depicts various embodiments of the stability network. LPT network 101 includes an inductor L1, an inductor L2, an inductor L3, and an inductor L4 that are connected in series. B+ communicates with one end of inductor L1 and one end of a capacitor C1. The other end of capacitor C1 couples to ground. A series combination of a resistor R1 and a capacitor C2 couples between ground and the junction of inductors L1 and L2. In some embodiments, resistor R1 may be replaced with a suitable dissipative element operating at a preselected frequency. Such dissipative element may be provided by suitable selection of the reactive elements in LPT network 101. A capacitor C3 couples between ground and the junction of inductors L2 and L3. A capacitor C4 couples between ground and the junction of inductors L3 and L4. The other end of inductor L4 is the output of LPT network 101 and couples with the drain of transistor 102. The values of inductors L1-L4 and capacitors C1-C4 can be determined in accordance with the selection of $f_{c1}$.

Output network 106 includes a capacitor C5 that couples between ground and the drain of transistor 102. An inductor L6 couples between the drain of transistor 102 and first ends of a capacitor C7 and a capacitor C8. A second end of capacitor C7 couples to ground. A second end of capacitor C8 couples to one end of an inductor L7 and provides the output of output network 106. The other end of inductor L7 couples to ground.

Figure 8:
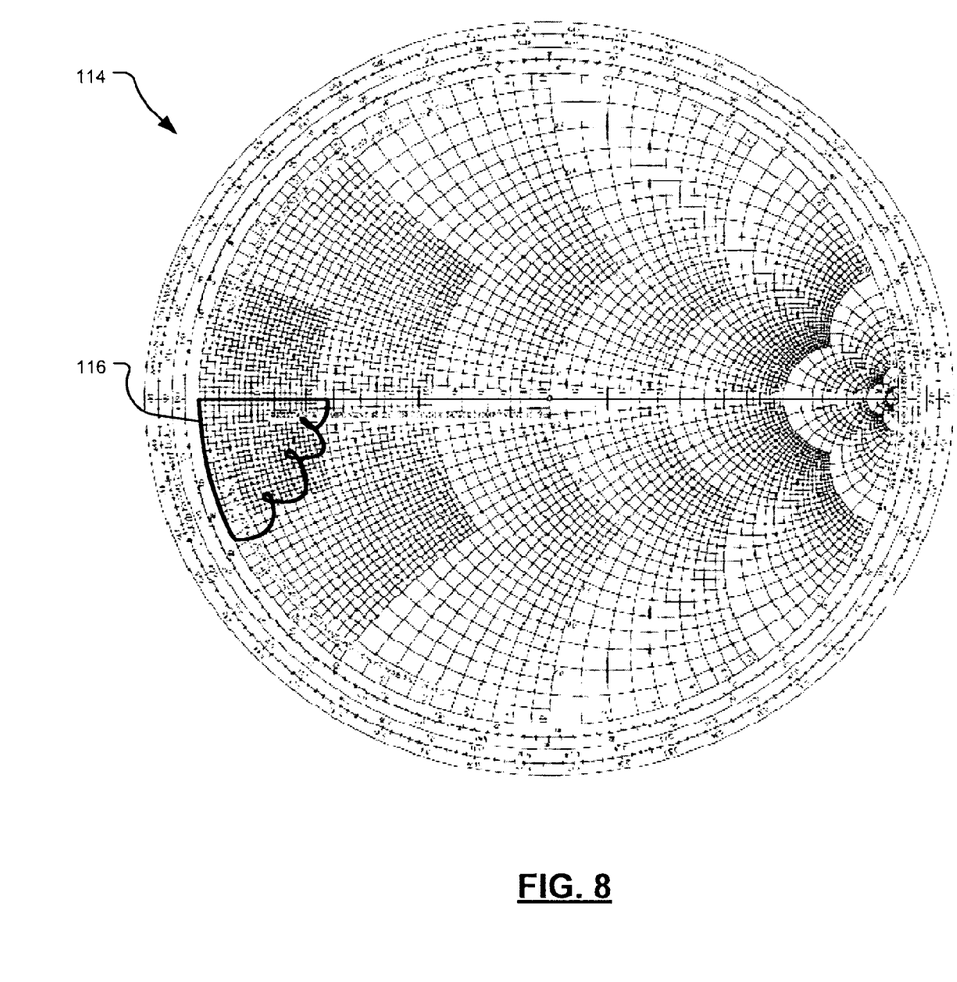
FIG. 8 is a Smith chart of power reflections in the plasma processing system with a stability network.

Offline short 112 includes a series-resonant combination of an inductor L5 and a capacitor C6 coupled between ground and the output of transistor 102. Inductor L5 and capacitor C6 form a shunt network to shunt RF current to ground at a particular frequency in a subharmonic band, such as a sub-harmonic $0.5*f_0$. The predetermined frequency may be selected in accordance with various design considerations. For example, some power amplifier systems exhibit undesired outcomes at particular, predetermined frequencies, and it is desirable to eliminate such frequencies. In some embodiments, the values of inductor L5 and capacitor C6 can therefore chosen such that inductor L5 and capacitor C6 resonate at $0.5*f_0$. FIG. 8 depicts a Smith chart 114 demonstrating, by way of example, the effect of offline short 112. A plot 116 shows that offline short 112 generally shorts the subharmonics $0.5*f_0$ to ground.

Returning now to FIG. 7, HPT network 120 includes a capacitor C12, a capacitor C13, and a capacitor C14 connected in series. A resistor R2 couples between ground and the other end of capacitor C14. An inductor L11 couples between ground and the junction of capacitor C13 and capacitor C14. In some embodiments, resistor R2 may be replaced with a suitable dissipative element operating at a preselected frequency. Such dissipative element may be provided by suitable selection of the reactive elements in HPT network 120. An inductor L10 couples between ground and the junction of capacitor C12 and capacitor C13. The other end of capacitor C12 is the input of HPT network 120. In some embodiments, the values of inductors L10-L12 and capacitors C12-C14 can be determined based on $f_{c3}$ and R2.

HPSH filter 108 includes a T-network formed from a series connection of a capacitor C10 and a capacitor C11. A center tap of the series connection couples with one end of an inductor L9. The other end of inductor L9 couples to ground. The other end of capacitor C10 is the input of HPSH filter 108. The other end of capacitor C11 is the output of HPSH filter 108.

LPHI filter 122 includes an inductor L8, a capacitor C9, inductor L7, and a capacitor C12. Inductor L7 is therefore a component of output network filter 122 and HPSH filter 108. Similarly, capacitor C12 is therefore a component of LPHI filter 122 and HPT 20. A first end of inductor L8 communicates with inductor L7 and is the input of LPHI filter 122. A second end of inductor L8 connects to one end of capacitor C9 and the input of HPLI 108. The other end of capacitor C9 couples to ground.

Simulation results demonstrate the effectiveness of the system described herein for the input impedance (Z) of the stability network as seen by transistor 102. The simulation can include replacing plasma chamber 110 with a corresponding unterminated feed line having a length of 0 λ, ⅛ λ, ¼ λ, ½ λ, and ¾ λ. respectively. Lambda (λ) is the wavelength of center frequency $f_0$. In some simulations, the first and second cutoff frequencies $f_{c1}$ and $f_{c2}$ may be set to $0.6*f_0$, and the third and fourth cutoff frequencies $f_{c3}$ and $f_{c4}$ may be set to $1.66*f_0$. Removing plasma chamber 110 provides an infinite-to-one voltage standing wave ratio (VSWR) at the output of HPSH filter 108. The infinite-to-one VSWR presents the stability network with a worst-case load since the unterminated feed line is purely reactive and reflects all of the RF power.

According to various simulations, at the lowest frequencies, the impedance Z remains relatively constant due to the dissipative load provided by LPT network 101. HPSH filter 108 also helps to isolate the unterminated load from transistor 102 at the lowest frequencies. The impedance Z drops sharply at $0.5*f_0$ due to the effects of offline short 112. The impedance Z rises again between $0.5*f_0$ and $0.6*f_0$ again due to LPT network 101 and HPSH filter 108. Between $0.6*f_0$ and $1.66*f_0$ the impedance Z varies with frequency and the length of the unterminated feed line. The varying impedance Z in this frequency range shows that the RF power is coupled to the load.

The impedance Z again stabilizes at frequencies above $1.66*f_0$ due to the dissipative load provided by HPT network 120. LPHI filter 122 also helps isolate the unterminated load from transistor 102 at frequencies above $1.66*f_0$. Various simulations, therefore, demonstrate that the stability network provides an unconditionally stable load to RF transistor 102 for frequency ranges below $f_{c1}$ and above $f_{c3}$. At frequencies between $f_{c1}$ and $f_{c3}$ the stability network couples transistor 102 to plasma chamber 110.

Figure 9:
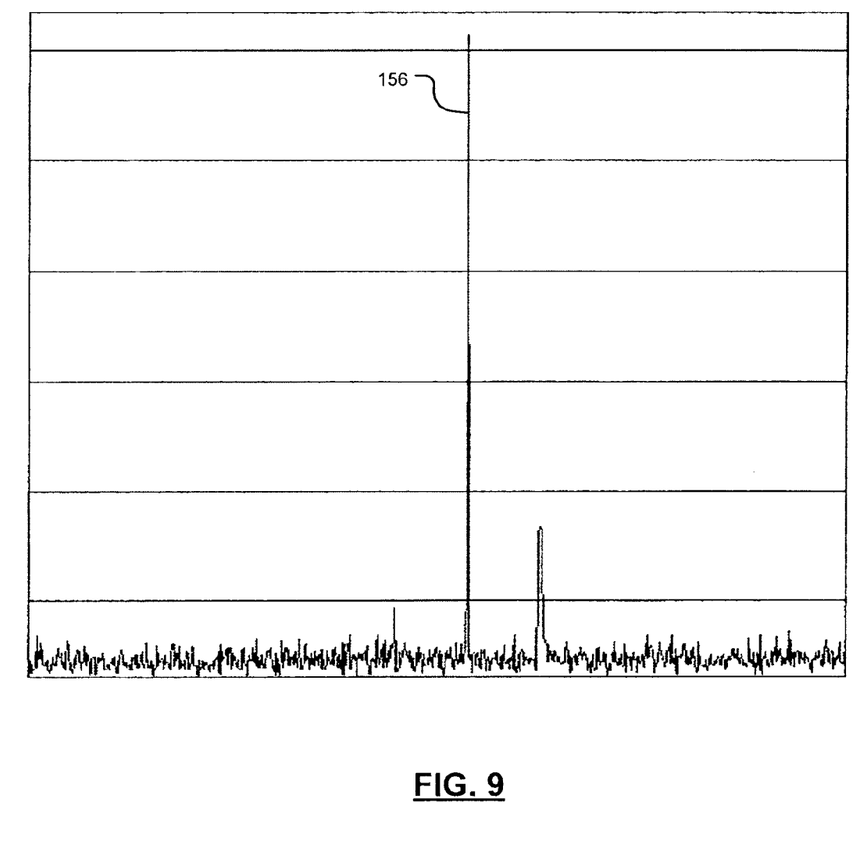
FIG. 9 is a test measurement of power perturbations due to spurious input impedance variations in a plasma chamber with a stability network.

Referring now to FIG. 9, and by way of non-limiting example, a test measurement for various embodiments illustrates a lack of spurious distortions that can cause a loss of fidelity in the RF power. A horizontal axis represents frequency. A vertical axis represents power coupled into plasma chamber 20. A first peak 156 occurs at center frequency $f_0$. Energy at frequencies other than $f_0$ indicates that the RF power is distorted at plasma chamber 20. The fidelity in FIG. 9 indicates an improvement over the fidelity of the test measurement of FIG. 4.

Figure 10:
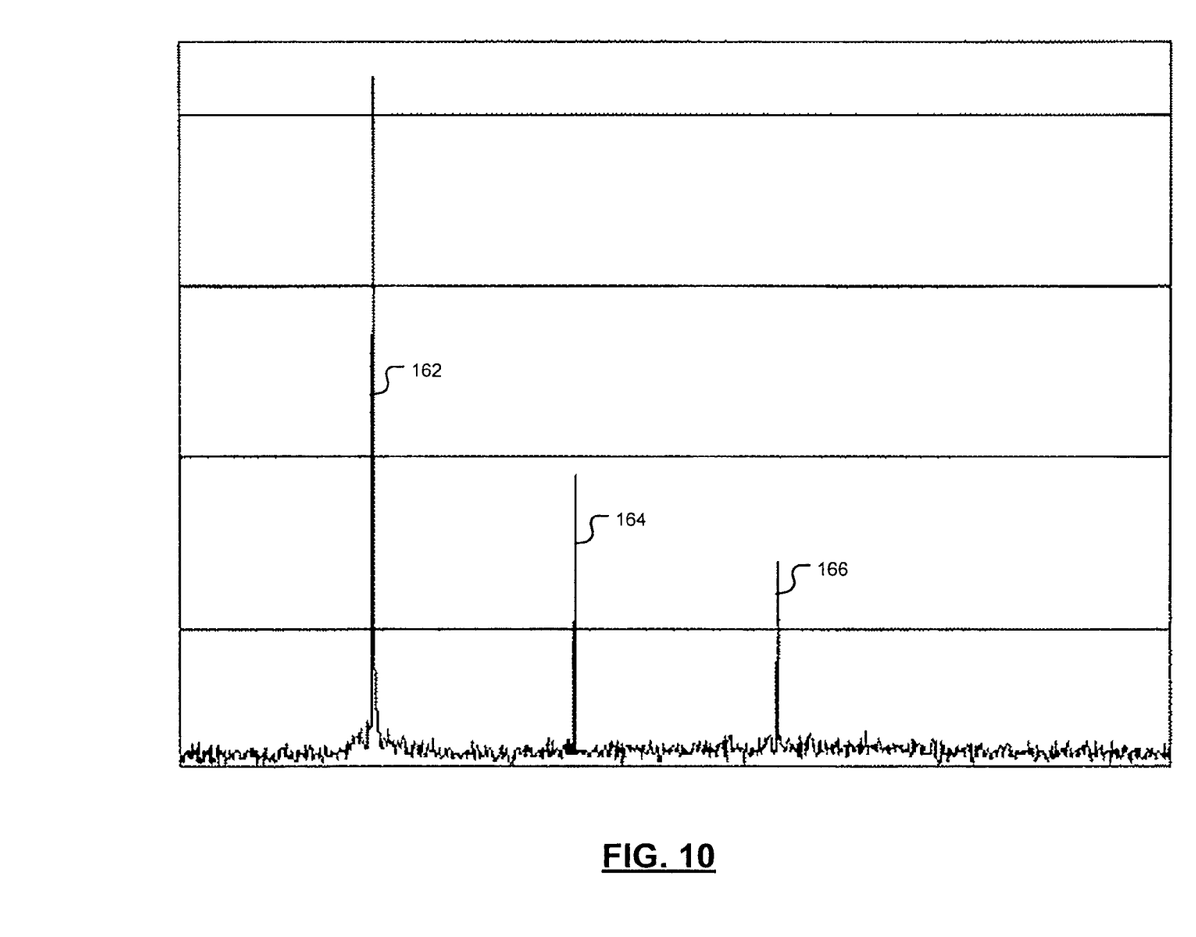
FIG. 10 is a test measurement of mass load harmonic distortion with inline mode isolation and a offline harmonic terminated.

Referring now to FIG. 10, and by way of non-limiting example, a test measurement for various embodiments illustrates the match load harmonic distortion with inline load isolation and offline harmonic terminated. A horizontal axis represents frequency. A vertical axis represents power coupled into plasma chamber 20. As can be seen in FIG. 10, a first peak 162 appears at center frequency $f_0$. A second peak 164 appears at a harmonic frequency of $f_0$, and a third peak 166 appears at another harmonic of center frequency $f_0$. FIG. 10 thus demonstrates the effectiveness of the combined inline load isolation and offline harmonic terminated. FIG. 10 thus demonstrates an improvement of combining match load harmonic distortion with inline load isolation and offline harmonic terminated.

Figure 11:
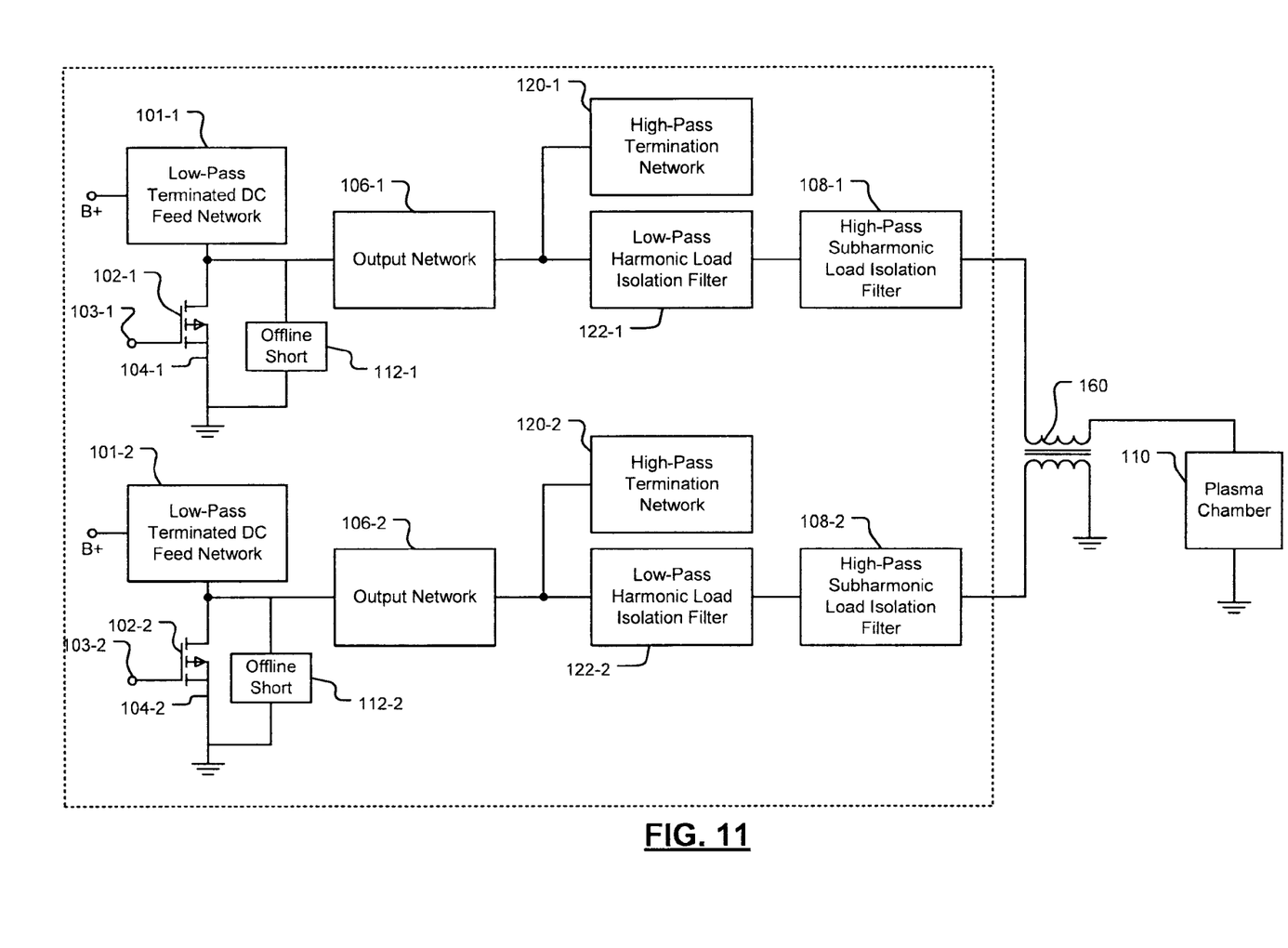
FIG. 11 is functional block diagram of a push-pull plasma processing system.

Referring now to FIG. 11, a pair of stability networks is shown applied to an RF plasma processing system in a push-pull configuration. A first transistor 102-1 provides RF power and connects with a first one of the stability networks. A second transistor 102-2 provides RF power 180 degrees out of phase from first transistor 102-1. Second transistor 102-2 connects with a second one of the stability networks. A balun 160 combines the RF power that appears at the outputs of the stability networks and applies the combined RF power to plasma chamber 110. In some embodiments balun 160 can include a transformer.

Figure 12:
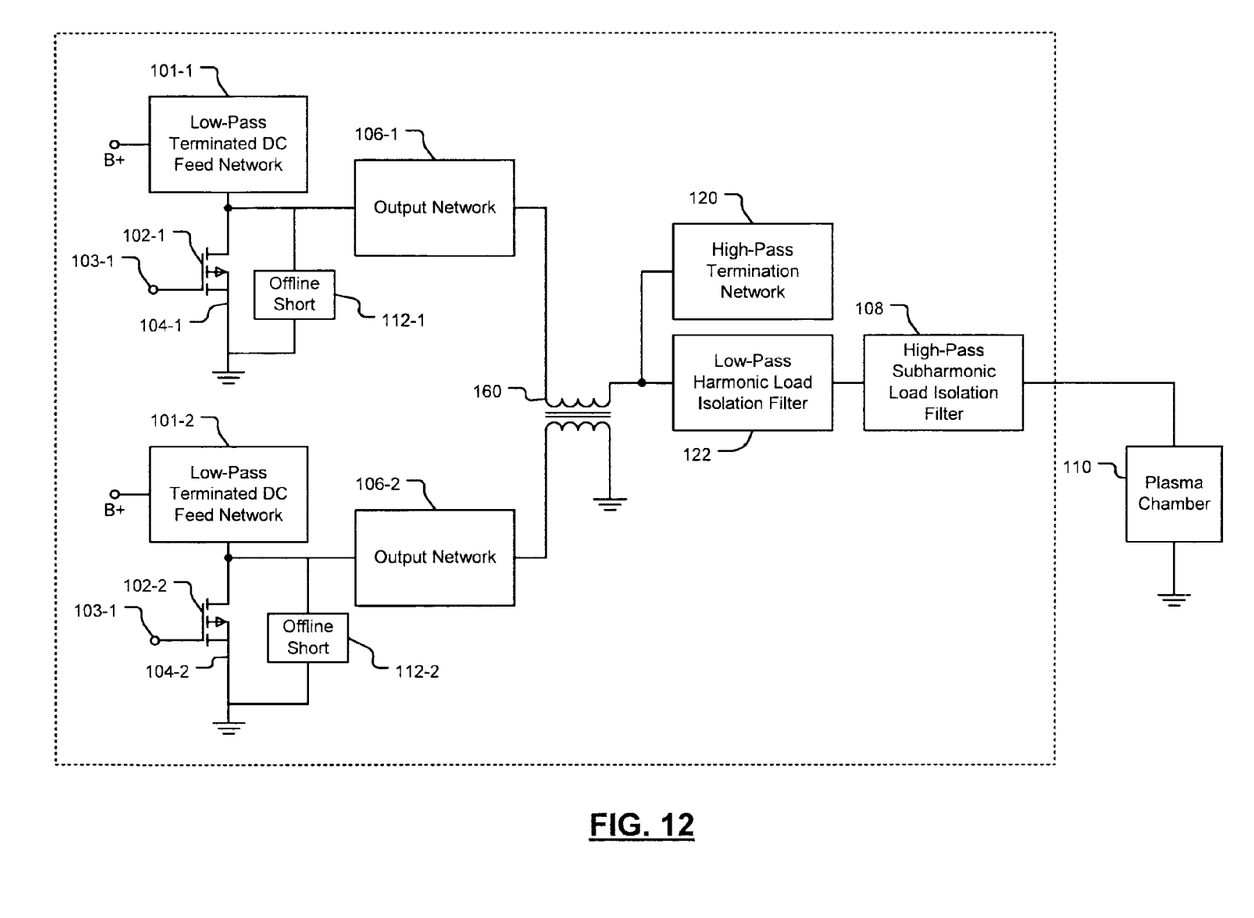
FIG. 12 is a functional block diagram of second push-pull plasma processing system.

Referring now to FIG. 12, the stability network is shown applied to an RF plasma processing system in a second push-pull configuration. First transistor 102-1 connects with a first output network 106-1. Second transistor 102-2 connects with a second output network 106-2. Respective outputs of first and second output networks 106 are applied to inputs of balun 160. An output of balun 160 communicates with the inputs of HPT network 120 and LPHI filter 122. An output of LPHI filter 122 communicates with the input of HPSH filter 108. The output of HPSH filter 108 communicates with the input of plasma chamber 110. Drains of first transistor 102-1 and second transistor 102-2 receive B+ through respective LPT networks 101.

Figure 13:
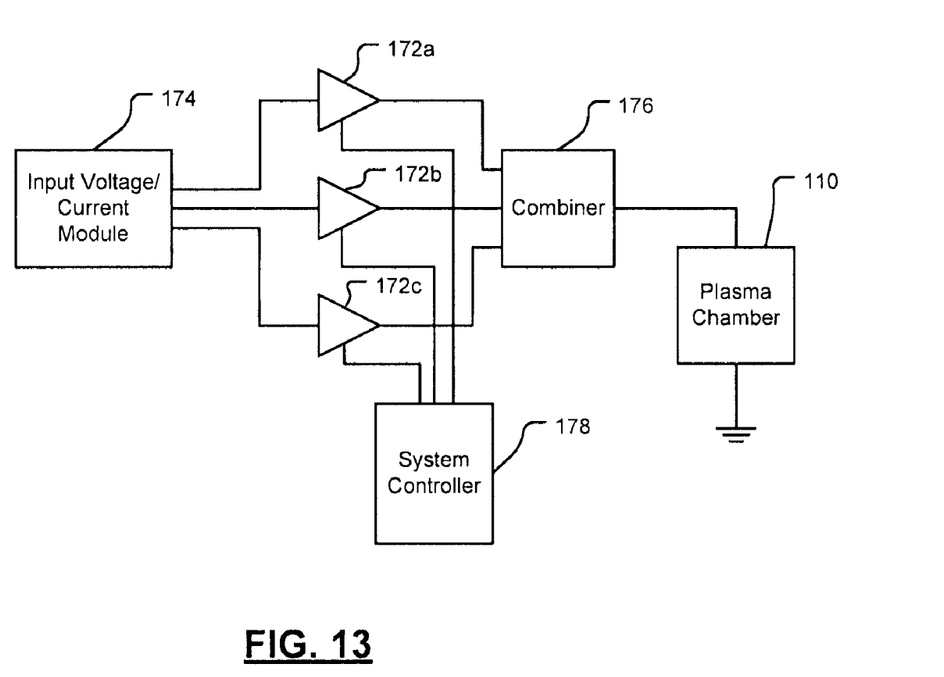
FIG. 13 depicts a block diagram of a plasma processing system having multiple power amplifiers.

FIG. 13 depicts a power generation system 170 for providing power to a plasma chamber 110 utilizing a plurality of power amplifiers 172a, 172b, and 172c. Power amplifiers 172a, 172b, and 172c can generally be embodied as depicted using reference number 100 of FIGS. 5 and/or 6 and/or the configurations of FIGS. 11 and/or 12. An input voltage/current module 174 provides an input voltage/current to each of power amplifiers 172a, 172b, and 172c. Each respective power amplifier 172a, 172b, and 172c receives the input voltage/current and amplifies the input to generate an amplified output applied to combiner 176. Combiner 176 combines the respective power outputs of amplifiers 172a, 172b, and 172c and generates a driving input to plasma chamber 110. A system controller 178 generates control signals to control at least power amplifiers 172a, 172b, and 172c and, in some embodiments, provides control inputs and/or receives monitoring signals from each of the respective power amplifiers 172a, 172b, and 172c, input voltage/current module 174, and combiner 176. It will be understood by one skilled in the art that FIG. 13 is generally intended to show the combinability of the various circuit depicted in FIGS. 5, 6, 11, and/or 12 in order to provide additional options for generating power to a plasma chamber 110.

The description herein is merely exemplary in nature and, thus, variations that do not depart from the gist of that which is described are intended to be within the scope of the teachings. Such variations are not to be regarded as a departure from the spirit and scope of the teachings.

What is claimed is:

1. A radio frequency generator for applying RF power to a load, comprising:
   a DC power supply;
   at least one switch that generates the RF power at a center frequency; and
   a low-pass terminated network connected between the DC power supply and the switch and having a first cutoff frequency that is less than the center frequency, the low-pass terminated network providing offline impedance control at a frequency less than the center frequency; and
   a high-pass filter interposed between an output of the switch and the load, the high-pass filter having a second cutoff frequency less than the center frequency, the high-pass filter providing inline isolation of the switch from the load at a frequencies less than the center frequency.

2. The RF generator of claim 1 wherein the low-pass terminated network and high-pass filter are adapted to enable the RF generator to operate at the center frequency or a band of frequencies below the center frequency.

3. The RF generator of claim 1 further comprising an output network arranged in series with the high-pass filter.

4. The RF generator of claim 3 wherein the output network is interposed between the switch and the high-pass filter.

5. The RF generator of claim 3 wherein the output network and high pass filter include common components.

6. The RF generator of claim 1 wherein the low-pass terminated network includes a dissipative element.

7. The RF generator of claim 1 wherein the low-pass terminated network presents an inductive load to the transistor.

8. The RF generator of claim 1 wherein the first cutoff frequency is equal to about 0.6 times the center frequency.

9. The RF generator of claim 1 wherein the second cutoff frequency is equal to about 0.6 times the center frequency.

10. The RF generator of claim 1 further comprising a high-pass terminated network connected offline from the RF power and having a third cutoff frequency that is greater than the center frequency, the high-pass terminated network providing offline impedance control for the switch at a frequency greater than the center frequency.

11. The RF generator of claim 10 wherein the high-pass terminated network includes a dissipative element.

12. The RF generator of claim 10 wherein the high-pass terminated network presents a reactance in a predetermined frequency range.

13. The RF generator of claim 10 wherein the third cutoff frequency is equal to about 1.66 times the center frequency.

14. The RF generator of claim 1 further comprising a low-pass filter interposed between the load and the switch, the low-pass filter having a fourth cutoff frequency that is greater than the center frequency, the low-pass filter providing inline isolation of the switch from the load at a frequency greater than the center frequency.

15. The RF generator of claim 14 wherein the fourth cutoff frequency is equal to about 1.66 times the center frequency.

16. The RF generator of claim 1 further comprising a shunt network offline from the RF power and including a band-pass frequency.

17. The RF generator of claim 16 wherein the band-pass frequency is 0.5 times the center frequency.

18. A radio frequency generator for applying RF power to a plasma chamber, comprising:
   a DC power supply;
   a radio frequency transistor that generates the RF power at a center frequency; and
   a stability network including:
      a low-pass terminated network connected inline with the DC power supply and the transistor, the low-pass terminated network and having a first cutoff frequency less than the center frequency; and
      a high-pass filter inline with the RF power, the high-pass filter having a second cutoff frequency less than the center frequency, low-pass terminated network and high-pass filter cooperating with the low-pass terminated network to control an impedance at the transistor over a predetermined frequency of operation below the center frequency.

19. The RF generator of claim 18 wherein the second cutoff frequency is equal to about 0.6 times the center frequency.

20. The RF generator of claim 18 wherein the high-pass dissipative terminated network includes a dissipative element.

21. The RF generator of claim 18 further comprising a fidelity network including:
   a high-pass terminated network connected offline from the RF power and having a third cutoff frequency that is greater than the center frequency; and
   a low-pass filter inline with the RF power, the low-pass filter having a fourth cutoff frequency that is greater than the center frequency, the high-pass terminated network and low-pass filter cooperating to control an impedance at the transistor over a predetermined frequency of operation above the center frequency.

22. The RF generator of claim 21 wherein the high-pass dissipative terminated network presents a reactance in a predetermined frequency range of operation.

23. The RF generator of claim 21 wherein the third cutoff frequency is equal to about 1.66 times the center frequency.

24. The RF generator of claim 21 wherein the fourth cutoff frequency is equal to about 1.66 times the center frequency.

25. The RF generator of claim 21 further comprising a band-pass filter connected to the RF power and including a band-pass center frequency that is less than the center frequency.

26. The RF generator of claim 25 wherein the band-pass center frequency is 0.5 times the center frequency.

27. A radio frequency generator for applying RF power to a plasma chamber, comprising:
   radio frequency transistors that generate RF power at a center frequency;
   low-pass dissipative terminated networks connected between respective ones of the transistors and associated DC power sources; and
   a combiner that generates an RF power signal based on the RF power from the radio frequency transistors, wherein the RF power signal is applied to the load; and
   wherein the low-pass dissipative terminated networks have a first cutoff frequency that is less than the center frequency.

28. The RF generator of claim 27 wherein the low-pass dissipative terminated networks include a respective dissipative element.

29. The RF generator of claim 27 wherein the low-pass dissipative terminated networks present a reactance in a predetermined frequency range.

30. The RF generator of claim 27 wherein the first cutoff frequency is equal to about 0.6 times the center frequency.

31. The RF generator of claim 27 further comprising high-pass filters in series with respective RF power from the transistors and having a second cutoff frequency that is less than the center frequency.

32. The RF generator of claim 31 wherein the second cutoff frequency is equal to about 0.6 times the center frequency.

33. The RF generator of claim 27 further comprising high-pass dissipative terminated networks connected to respective RF power from the transistors and including a third cutoff frequency that is greater than the center frequency.

34. The RF generator of claim 33 wherein the high-pass dissipative terminated networks include respective dissipative elements.

35. The RF generator of claim 33 wherein the high-pass dissipative terminated networks present a reactance at a predetermined frequency range.

36. The RF generator of claim 33 wherein the third cutoff frequency is equal to about 1.66 times the center frequency.

37. The RF generator of claim 27 further comprising a low-pass filter in series with respective RF power from the transistors and including a fourth cutoff frequency that is greater than the center frequency.

38. The RF generator of claim 37 wherein the fourth cutoff frequency is equal to about 1.66 times the center frequency.

39. The RF generator of claim 27 further comprising band-pass filters connected to respective RF power from the transistors and including a band-pass center frequency that is less than the center frequency.

40. The RF generator of claim 39 wherein the band-pass center frequency is 0.5 times the center frequency.

41. The RF generator of claim 27 further comprising a high-pass filter in series with the RF power signal and including a second cutoff frequency that is less than the center frequency.

42. The RF generator of claim 41 wherein the second cutoff frequency is equal to about 0.6 times the center frequency.

43. The RF generator of claim 27 further comprising a high-pass dissipative terminated network connected to the RF power signal and including a third cutoff frequency that is greater than the center frequency.

44. The RF generator of claim 43 wherein the high-pass dissipative terminated network includes a dissipative element.

45. The RF generator of claim 43 wherein the high-pass dissipative terminated network presents a reactance in a predetermined frequency range.

46. The RF generator of claim 43 wherein the third cutoff frequency is equal to about 1.66 times the center frequency.

47. The RF generator of claim 27 further comprising a low-pass filter in series with the RF power signal and including a fourth cutoff frequency that is greater than the center frequency.

48. The RF generator of claim 47 wherein the fourth cutoff frequency is equal to about 1.66 times the center frequency.

49. The RF generator of claim 27 further comprising a band-pass filter connected to the RF power signal and including a band-pass center frequency that is less than the center frequency.

50. The RF generator of claim 49 wherein the band-pass center frequency is 0.5 times the center frequency.

51. A radio frequency generator for applying RF power to a plasma chamber, comprising:
   radio frequency transistors that generate RF power at a center frequency;
   high-pass filters in series with respective RF power from the transistors and including a first cutoff frequency that is less than the center frequency; and
   a combiner that generates an RF power signal based on the RF power from the radio frequency transistors, wherein the RF power signal is applied to the plasma generator.

52. The RF generator of claim 51 wherein the first cutoff frequency is equal to about 0.6 times the center frequency.

53. The RF generator of claim 51 further comprising high-pass dissipative terminated networks connected to the RF power from respective transistors and including a second cutoff frequency that is greater than the center frequency.

54. The RF generator of claim 53 wherein the high-pass dissipative terminated networks include a respective dissipative element.

55. The RF generator of claim 53 wherein the high-pass dissipative terminated networks present a reactance in a predetermined frequency range.

56. The RF generator of claim 53 wherein the second cutoff frequency is equal to about 1.66 times the center frequency.

57. The RF generator of claim 51 further comprising low-pass filters in series with the RF power from respective transistors and including a third cutoff frequency that is greater than the center frequency.

58. The RF generator of claim 57 wherein the third cutoff frequency is equal to about 1.66 times the center frequency.

59. The RF generator of claim 51 further comprising band-pass filters connected to the RF power from respective transistors and including a band-pass center frequency that is less than the center frequency.

60. The RF generator of claim 59 wherein the band-pass center frequency is 0.5 times the center frequency.

61. A radio frequency generator for applying RF power to a plasma chamber, comprising:
   radio frequency transistors that generate RF power at a center frequency;
   a combiner that generates an RF power signal based on the RF power from the radio frequency transistors; and
   a stability network including a high-pass filter inline with the RF power and located in close proximity to an output of the radio frequency transistor, the high-pass filter having a first cutoff frequency less than the center frequency.

62. The radio frequency generator of claim 61 further comprising a low-pass terminated network connected inline with the DC power supply and the transistors, the low-pass terminated network having a second cutoff frequency less than the center frequency, the low-pass terminated network and high-pass filter cooperating with the low-pass terminated network to control an impedance at the transistor over a predetermined frequency of operation below the center frequency.

63. The RF generator of claim 61 wherein the first cutoff frequency is equal to about 0.6 times the center frequency.

64. The RF generator of claim 61 further comprising a high-pass dissipative terminated network connected offline from the RF power signal and including a third cutoff frequency that is greater than the center frequency.

65. The RF generator of claim 64 wherein the high-pass dissipative terminated network includes a dissipative element.

66. The RF generator of claim 64 wherein the high-pass dissipative terminated network presents a reactance in a predetermined frequency range.

67. The RF generator of claim 64 wherein the third cutoff frequency is equal to about 1.66 times the center frequency.

68. The RF generator of claim 62 further comprising a low-pass filter inline with the RF power signal and including a fourth cutoff frequency that is greater than the center frequency.

69. The RF generator of claim 68 wherein the fourth cutoff frequency is equal to about 1.66 times the center frequency.

70. The RF generator of claim 62 further comprising a band-pass filter connected to the RF power signal and including a band-pass center frequency that is less than the center frequency.

71. The RF generator of claim 70 wherein the band-pass center frequency is 0.5 times the center frequency.

\* \* \* \* \*